(12) United States Patent
Sagae et al.

(10) Patent No.: US 7,682,982 B2
(45) Date of Patent: Mar. 23, 2010

(54) PLASMA PROCESSING APPARATUS AND CONTROL METHOD THEREOF

(75) Inventors: Naoto Sagae, Miyagi-gun (JP); Hiroshi Tsuchiya, Nirasaki (JP); Tsutomu Higashiura, Nirasaki (JP); Hideo Kato, Nirasaki (JP); Ryuji Ohtani, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 929 days.

(21) Appl. No.: 11/060,547

(22) Filed: Feb. 18, 2005

(65) Prior Publication Data
US 2005/0205208 A1 Sep. 22, 2005

(30) Foreign Application Priority Data
Feb. 20, 2004 (JP) ............................... 2004-045172

(51) Int. Cl.
*H01L 21/302* (2006.01)
(52) U.S. Cl. ................. 438/714; 438/710; 438/711; 156/345.39; 156/345.43
(58) Field of Classification Search ............... 216/67, 216/71; 438/714, 729, 706, 710, 711, 712; 156/345.43, 345.44, 345.47, 44, 345.39, 156/43; 118/723 E
See application file for complete search history.

(56) References Cited

U.S. PATENT DOCUMENTS

| 5,716,534 | A | 2/1998 | Tsuchiya et al. |
|---|---|---|---|
| 6,426,477 | B1 * | 7/2002 | Koshimizu et al. ..... 219/121.41 |
| 6,576,860 | B2 * | 6/2003 | Koshimizu et al. ..... 219/121.43 |
| 6,762,129 | B2 | 7/2004 | Yamashita et al. |
| 7,148,151 | B2 | 12/2006 | Yamashita et al. |
| 7,341,922 | B2 | 3/2008 | Yamashita et al. |
| 7,402,527 | B2 | 7/2008 | Yamashita et al. |
| 2003/0132195 | A1 * | 7/2003 | Edamura et al. ............... 216/59 |
| 2005/0142873 | A1 * | 6/2005 | Shindo et al. ............... 438/680 |

FOREIGN PATENT DOCUMENTS

| JP | 6-318552 | 11/1994 |
|---|---|---|
| JP | 2001-156051 | 6/2001 |
| JP | 2002-9060 | 1/2002 |

\* cited by examiner

*Primary Examiner*—Lan Vinh
(74) *Attorney, Agent, or Firm*—Oblon, Spivak, McClelland, Maier & Neustadt, L.L.P.

(57) ABSTRACT

There is provided a plasma processing apparatus includes a lower electrode in a processing chamber on which a object to be processed is mounted; an upper electrode confronting the lower electrode; a first and a second high-frequency power supply for applying high-frequency powers respectively to the upper and the lower electrode; and an output controller for raising each of outputs from the high-frequency power supplies at least three times in a stepwise manner up to each of set levels for processing the object to be processed. The output controller adjusts each of rising times of the outputs from the high-frequency power supplies so that an output of the second high-frequency power supply is raised earlier than an output of the first high-frequency power supply while the outputs from the high-frequency power supplies are raised up to the set levels in a stepwise manner.

16 Claims, 4 Drawing Sheets

FIG. 4
| TIME | 0 S | 0.4 S | 0.8 S | ....... | 2.0 S | 2.4 S | 2.8 S |
|---|---|---|---|---|---|---|---|
| UPPER RF | 0 W | 400 W | 400 W | ....... | 1200 W | 1200 W | 3300 W |
| LOWER RF | 400 W | 400 W | 800 W | ....... | 1200 W | 3800 W | 3800 W |
FIG. 5
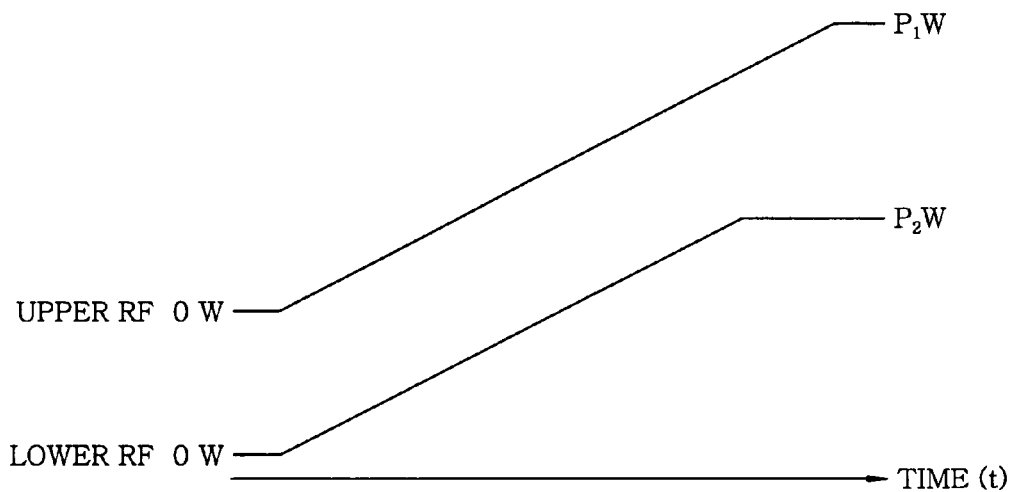
FIG. 6
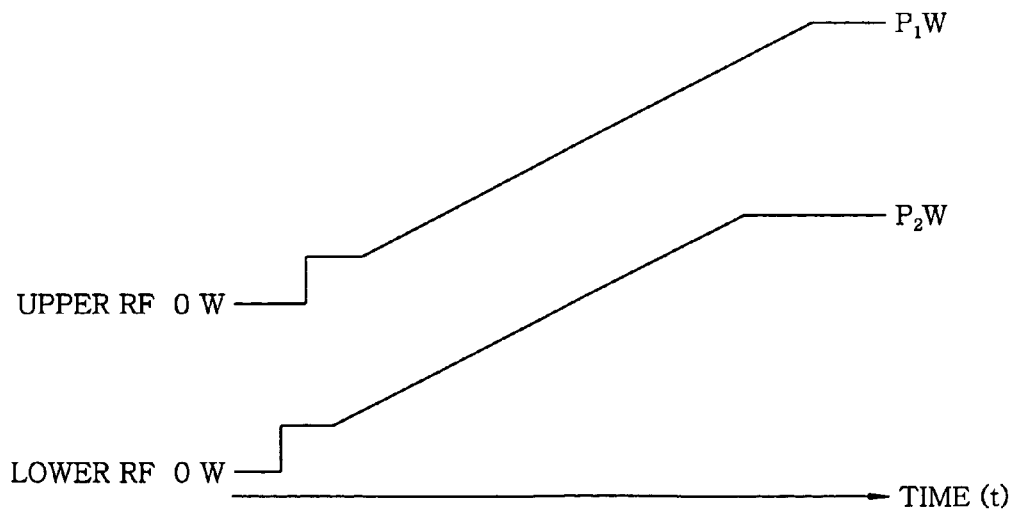

PLASMA PROCESSING APPARATUS AND CONTROL METHOD THEREOF

FIELD OF THE INVENTION

The present invention relates to a plasma processing apparatus and a control method thereof.

BACKGROUND OF THE INVENTION

Conventionally, a plasma processing apparatus which employs high-frequency glow discharge of a reactive gas introduced into a processing chamber has been widely used for a semiconductor fabrication process in order to perform a microprocessing on an object to be processed such as a semiconductor wafer. A plasma processing apparatus which employs high-frequency glow discharge, otherwise known as a parallel plate type plasma processing apparatus, includes an upper electrode and lower electrode and performs a plasma processing on an object to be processed mounted on the lower electrode by applying a high-frequency power only to the upper electrode.

However, such a plasma processing apparatus has disadvantages in that it is difficult to control plasma voltage between the two electrodes, and some of electrical discharges will be lost through the wall surface in the processing chamber which is grounded, thereby making plasma non-uniform and unstable. Consequently, the apparatus tend to be unsuitable for microprecessing on a quarter-micron to half-micron scale as demanded in the industry recently.

Therefore, attempts are underway to control the density of plasma generated in a processing chamber by applying high-frequency powers to an upper and lower electrode for microprocessing. FIG. 8 illustrates an example of such a plasma processing apparatus. A processing chamber 100 includes a lower electrode 102 to be mounted thereon an object to be processed W in a processing chamber 101, and an upper electrode 103 facing the lower electrode 102, wherein a first high-frequency power supply 106 applies a first high-frequency power to the upper electrode 103 via a first matching unit 107, and a second high-frequency power supply 108 applies a second high-frequency power to the lower electrode 102 via a second matching unit 109, thereby controlling the density of plasma generated in the processing chamber 101. Thus, a glow discharge is formed between the lower electrode 102 (grounded) and the upper electrode 103 to give rise to a plasma of reactive gas species. Desired etching is performed by making ions in the plasma hit the surface of an object to be processed mounted on the lower electrode 102 through the use of a potential difference between the two electrodes.

With respect to managing the problems of microprocessing, attempts are underway to achieve a high selectivity and high etching-rate without charge-up damages by setting the process condition at low pressure, e.g., 100 mTorr or less, or otherwise using certain gases.

(Reference 1) Japanese Patent Laid-open Application No. H8-162293

(Reference 2) U.S. Pat. No. 5,716,534

However, when using a conventional plasma processing apparatus such as in FIG. 8, it is difficult to control the process as desired during the plasma generation stage because of interferences between high-frequency power signals from the two high-frequency power supplies, or distortions in waveform thereof. At times, an object to be processed is subject to charge-up damages.

Further, depending on the manner in which two high-frequency power supplies provide high-frequency powers, the high frequency power or the matching unit can be overloaded or some plasma can be lost by an activation of a safety circuit therein. This can be caused by, for example, generation of reflected waves from an abrupt impedance change in the plasma processing apparatus.

To solve the above problems, the present inventor developed the methods disclosed in References 1 and 2 in order to reduce damages in an object to be processed. With these methods, a plasma for etching is generated by forming a plasma through applying a high-frequency power to one electrode first, then, a high-frequency power is applied to the other electrode. As a result, the dissociation rate increases and the plasma density becomes high, thereby reducing charge-up damages in the object to be processed.

However, as demands for microprocessing on a smaller scale and for extending useful life of a plasma processing apparatus have been growing, it has become necessary to further minimize damages on an object to be processed and to reduce loads on a high-frequency power supply, matching unit, and the like.

SUMMARY OF THE INVENTION

The present invention has been developed to solve the above problems of the conventional plasma processing apparatus by providing a new or improved plasma processing apparatus or a control method thereof, capable of efficient plasma generation, reducing damages on an object to be processed and reducing the loads on a high-frequency power supply, matching unit or so forth.

To solve the above problems, in accordance with one aspect of the present invention, there is provided a plasma processing apparatus, comprising: a lower electrode disposed in a processing chamber, capable of mounting an object to be processed thereon; an upper electrode disposed in the chamber to face the lower electrode; a first high-frequency power supply for applying high-frequency power to the upper electrode; a second high-frequency power supply for applying high-frequency power to the lower electrode; an output controller for raising stepwise, respective outputs of the high-frequency power supplies up to respective set levels for processing the object to be processed in at least three steps, wherein the output controller regulates raise timings of the outputs of the respective high-frequency power supplies so that raising the output of the second high-frequency power supply is followed by raising the output of the first high-frequency power supply, while the outputs of the high-frequency power supplies are raised stepwise up to the respective set levels.

In order to solve the aforementioned problems, in accordance with another aspect of the present invention, there is provided a plasma processing apparatus, comprising: a lower electrode disposed in a processing chamber, capable of mounting an object to be processed thereon; an upper electrode disposed in the chamber to face the lower electrode; a first and a second high-frequency power supply for applying high-frequency power to the lower electrode; an output controller for raising stepwise, respective outputs of the high-frequency power supplies up to respective set levels for processing the object to be processed in at least three steps, wherein the output controller regulates raise timings of the outputs of the respective high-frequency power supplies so that raising the output of the second high-frequency power supply is followed by raising the output of the first high-frequency power supply, while the outputs of the high-frequency power supplies are raised stepwise up to the respective set levels.

In order to solve the aforementioned problems, in accordance with still another aspect of the present invention, there is provided a method for controlling a plasma processing apparatus including a lower electrode in a processing chamber on which an object to be processed is mounted, an upper electrode disposed in the chamber to face the lower electrode, a first high-frequency power supply for applying a high-frequency power to the upper electrode and a second high-frequency power supply for applying a high-frequency power to the lower electrode, comprising the steps of: raising respective outputs of the high-frequency power supplies at least three times stepwise to reach respective set levels for processing the object to be processed; and controlling respective raise timings of the outputs of the high-frequency power supplies so that raising the output of the second high-frequency power supply is followed by raising the output of the first high-frequency power supply while the respective outputs of the high-frequency power supplies are raised to the respective set levels.

In order to solve the aforementioned problems, in accordance with still another aspect of the present invention, there is provided a method for controlling a plasma processing apparatus including a lower electrode in a processing chamber on which an object to be processed is mounted, an upper electrode disposed to face the lower electrode and a first and a second high-frequency power supply for applying high-frequency powers to the lower electrode, comprising the steps of: raising respective outputs of the high-frequency power supplies at least three times stepwise to reach respective set levels for processing the object to be processed; and controlling respective raise timings of the outputs of the high-frequency power supplies so that raising the output of the second high-frequency power supply is followed by raising the output of the first high-frequency power supply while the respective outputs of the high-frequency power supplies are raised to the respective set levels.

Further, in the apparatuses and the methods, the output controller regulates the outputs of the respective high-frequency power supplies so that the outputs right before reaching the respective set levels are within 25% and 50% of the set levels. In this case, it is preferable that the output controller regulates the outputs of the respective high-frequency power supplies so that first outputs are equal to or above levels at which plasma can be ignited and not more than 25% of the respective set levels.

Still further, in the apparatuses and the methods, the output controller regulates the outputs of the respective high-frequency power supplies so that, while keeping the output of one high-frequency power supply constant, the output of the other high-frequency power supply is raised. Otherwise, the output controller regulates the outputs of the respective high-frequency power supplies so that differences between the respective outputs fall within a certain range.

In order to solve the aforementioned problems, in accordance with another aspect of the present invention, there is provided A plasma processing apparatus, comprising: a lower electrode disposed in a processing chamber, capable of mounting an object to be processed thereon; an upper electrode disposed in the chamber to face the lower electrode; a first and a second high-frequency power supply for applying high-frequency power to the electrodes; an output controller for continuously raising respective outputs of the high-frequency power supplies to respective set levels for processing the object to be processed or for raising the respective outputs of the high-frequency power supplies to the respective set levels stepwise during a certain interval and continuously during the rest.

In order to solve the aforementioned problems, in accordance with still another aspect of the present invention, there is provided a method for controlling a plasma processing apparatus including a lower electrode in a processing chamber on which a object to be processed is mounted, an upper electrode disposed in the chamber to face the lower electrode and a first and a second high-frequency power supply for applying high-frequency powers to the electrodes, comprising the steps of continuously raising respective outputs of the high-frequency power supplies to respective set levels for processing the object to be processed or for raising the respective outputs of the high-frequency power supplies to the respective set levels stepwise during a certain interval and continuously during the rest.

Further, in the apparatus and the method, the output controller regulates the outputs of the respective high-frequency power supplies so that ratios between the respective outputs remain constant or so that slopes of the outputs of the respective power supplies are identical as they go up. Still further, the output controller regulates the respective outputs of the high-frequency power supplies so that the respective outputs are raised to the respective set levels stepwise during a certain interval and continuously during the rest. In this case, it is preferable that the part during which the outputs go up stepwise is the initial period when plasma is ignited.

Still further, in the apparatus and the method, the output controller regulates the outputs of the respective high-frequency power supplies so that the output of one high-frequency power supply goes up stepwise while the other output goes up continuously. In this case, it is preferable that the output of the first high-frequency power supply is applied to the upper electrode and the output of the second high-frequency power supply is applied to the lower electrode, the output controller regulating the respective outputs so that the output of the first high-frequency power supply goes up stepwise and the output of the second high-frequency power supply goes up continuously.

In accordance with the present invention, a plasma can be generated efficiently; damages on an object to be processed can be further reduced; and the loads on a high-frequency power supply, matching unit and so forth can be further reduced.

BRIEF DESCRIPTION OF THE DRAWINGS

The above and other objects and features of the present invention will become apparent from the following description of preferred embodiments, given in conjunction with the accompanying drawings, in which:

FIG. 4 presents a more specific example of raise timings shown in FIG. 3;

FIG. 5 offers another example of raise timings of high-frequency powers applied to two electrodes in the plasma etching apparatus in accordance with the preferred embodiment of the present invention, wherein the respective high-frequency powers are raised to set levels continuously;

FIG. 6 represents another example of raise timings of high-frequency powers applied to two electrodes in the plasma etching apparatus in accordance with the preferred embodiment of the present invention, wherein the respective high-frequency powers are raised stepwise in the initial stage and then continuously thereafter;

DETAILED DESCRIPTION OF THE PREFERRED EMBODIMENT

Figure 1:
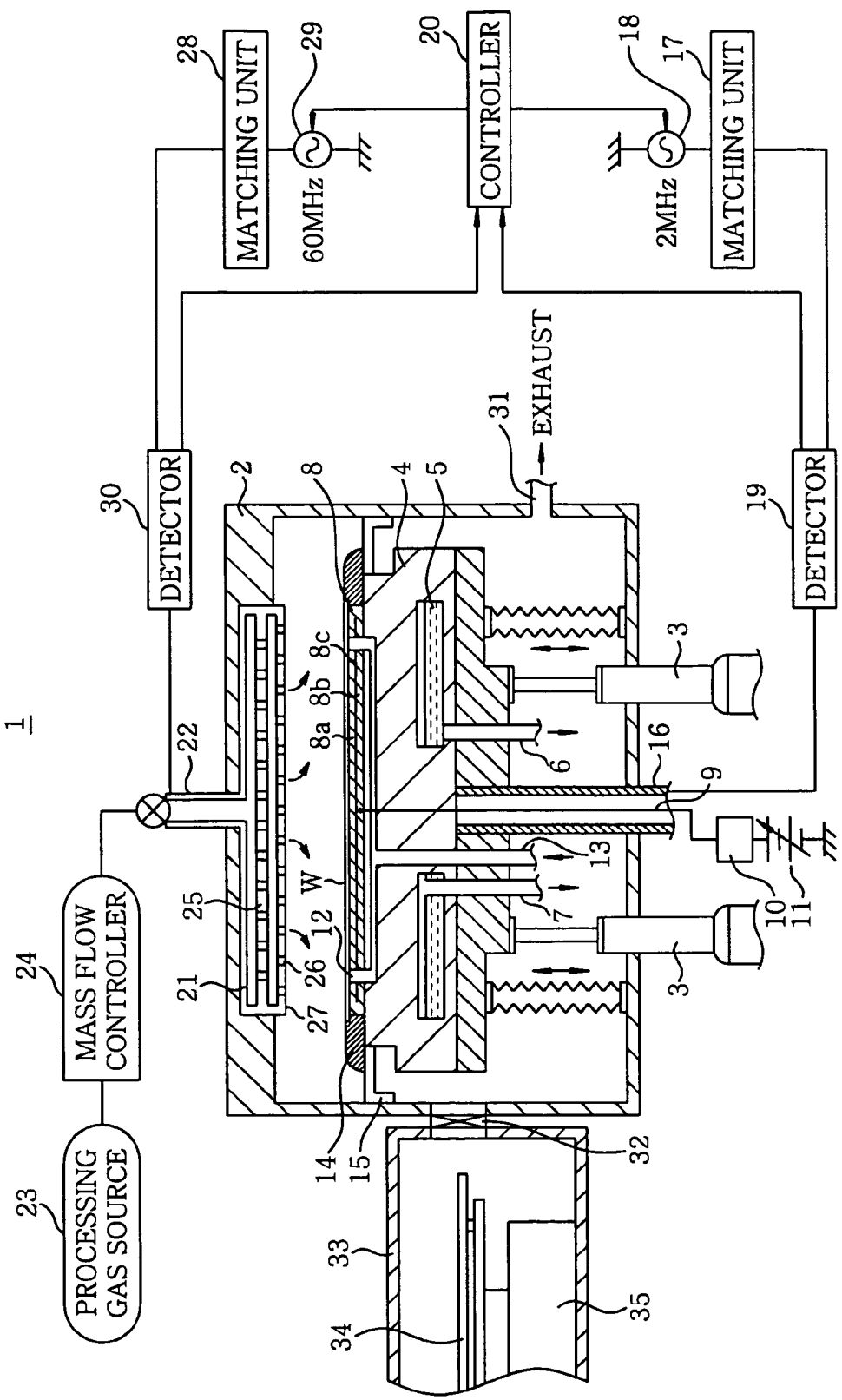
FIG. 1 shows a cross sectional view illustrating a schematic configuration of a plasma etching apparatus in accordance with a preferred embodiment of the present invention.

Hereinafter, a preferred embodiment of the present invention will be described in detail with reference to the accompanying drawings. Further, in this specification and the accompanying drawings, components having substantially identical functions and configurations are assigned an identical reference numeral to simplify their description.

A plasma etching apparatus 1 shown in FIG. 1 includes a processing chamber 2 formed in a cylindrical or rectangular shape made of conductive material, e.g., aluminum, and the processing chamber 2 houses therein a mounting table 4 of an approximately cylindrical shape for supporting an object to be processed, e.g., a wafer W, the mounting table 4 having a vertically movable structure by means of an elevation mechanism 3 such as a motor. It is possible to construct the mounting table 4 by securing a plurality of members formed of, e.g., aluminum by, e.g., bolts. Installed in the mounting table 4 is a heat source unit such as a heat transfer medium circulation unit 5, which is designed such that it can adjust temperature on the processing surface of the object to be processed to a desirable temperature.

A heat transfer medium of which temperature has been adjusted to an appropriate temperature by means of a temperature control unit (not shown in the drawings) can be introduced into the heat transfer medium circulation unit 5 via a heat transfer medium inlet line 6. The introduced heat transfer medium circulates in the heat transfer medium circulation unit 5 so that heat or cooling is transmitted into the semiconductor wafer W via the mounting table 4 during the circulation, thereby making it possible to adjust the temperature of the processing surface on the semiconductor wafer W to a desirable temperature. After the heat transfer process, the heat transfer medium is driven out of the chamber via the heat transfer medium discharge line 7. Further, although the illustrated example has such configuration in which the heat transfer medium of which temperature has been adjusted to an appropriate temperature by means of a temperature control not shown in the drawings is made to circulate, it is also possible to adopt a configuration in which a cooling jacket and a heater installed in the mounting table 4 heat or cool the mounting table 4 so that temperature of the wafer W can be controlled.

A central portion of an upper surface on the mounting table 4 has a shape of a projecting circular plate. A chuck portion for supporting a object to be processed such as an electrostatic chuck 8 is installed at the central portion of the upper surface on the mounting table 4, wherein a diameter of the electrostatic chuck 8 is approximately identical to, or slightly longer or shorter than, that of the semiconductor wafer W as a object to be processed. The electrostatic chuck 8, which supports the wafer W, is constituted by an electrostatic chuck sheet having a conductive film 8c of, e.g., copper foil inserted between two films 8a and 8b made of high molecular insulating material such as polyimide resin or the like. The conductive film 8c is connected to a variable DC voltage supply 11 via a voltage supply lead 9 and a filter 10 for cutting off a high-frequency signal, such as a coil. Thus, by applying a high power to the conductive film 8c, it is possible to adsorb the wafer W onto an upper surface on an upper film 8a in the electrostatic chuck by a Coulomb force. Besides, it has been described as to a case where the apparatus shown in FIG. 1 employs an electrostatic chuck 8 as a chuck unit for adsorbing a object to be processed, the present invention should not be construed to be limited thereto. For example, it is also possible to adopt a mechanical chuck unit for mechanically holding a object to be processed by means of an annular clamp member capable of a vertical movement. However, it is more preferable to adopt the electrostatic chuck 8 in that it can reduce damages on the wafer W.

In addition, the electrostatic chuck sheet 8 has a thermally conductive gas supply opening 12 formed in concentric circles. Connected to the thermally conductive gas supply opening 12 is a thermally conductive gas feed pipe 13 for supplying a thermally conductive gas such as helium from a gas source not shown in the drawings to a small space formed between a back side of the object to be processed W and the chuck surface on the electrostatic chuck 8, thereby enhancing the efficiency of thermal conduction from the mounting table 4 to the object to be processed W.

Moreover, on the mounting table 4, an annular focus ring 14 is set to enclose a periphery of the wafer W on the electrostatic chuck 8. The focus ring 14, made of insulating or conductive material that does not attract reactive ions, functions to make, for example, the reactive ions effectively projected only onto the semiconductor wafer W inside the focus ring. Placed between the mounting table 4 and an inner wall of the processing chamber 2 is a gas exhaust ring 15 having a plurality of baffle holes such that the gas exhaust ring 15 encloses the mounting table 4 and contacts an outer peripheral portion of the focus ring 14. The gas exhaust ring 15 renders exhaust streams arranged properly so that, for example, a processing gas is uniformly discharged from the inside of the processing chamber.

Further, the mounting table 4 is connected to a power feed rod made of conductive material and formed hollow, which is coupled to a second high-frequency power supply 18 via a matching unit 17 having, e.g., a blocking capacitor. During the process, a high-frequency power of, e.g., 2 MHz can be supplied to the mounting table 4 via the power fed rod 16. Additionally, a detector 19 is inserted between the matching unit 17 and the mounting table 4. Information on an output of the second high-frequency power supply 18 is detected by the detector 19 and then sent back to a controller 20 to be used during a control on the process. In addition, as will be described later, the controller 20 includes an output controller for controlling a high-frequency power output applied to an upper electrode 21 and the mounting table 4. As can be seen above, the mounting table 4 functions as a lower electrode so that, as will be explained later, glow discharge takes place between the mounting table 4 and the upper electrode 21 positioned to face the object to be processed W, thereby rendering the processing gas introduced into the processing chamber into a plasma state to enable an etching process on the object to be processed by using the plasma.

The upper electrode 21 is placed on a mounting surface of the mounting table 4 constituting a lower electrode (hereinafter, the mounting table will be also called "the lower electrode") in a manner that there is a certain distance, for example, that of about 5 to 150 mm, between the upper electrode 21 and the lower electrode 4. Moreover, the distance between the upper electrode 21 and the lower electrode 4 can be adjusted by elevating the lower electrode 4 by the elevation mechanism 3. In addition, it is possible to control plasma uniformity during a process by adjusting the above-mentioned distance pursuant to a film quality of a object to be processed.

Furthermore, similarly to the lower electrode 4, the upper electrode 21 is connected to a first high-frequency power supply 29 via a matching unit 28 having, e.g., a blocking capacitor. During the process, a high-frequency power of, e.g., 60 MHz can be supplied to the upper electrode 21. Additionally, a detector 30 is inserted between the matching unit 28 and the upper electrode 21. Information on an output of the first high-frequency power supply 29 is detected by the detector 19 and then sent back to the controller 20 to be used during process controls such as plasma ignition and stopping.

In addition, the upper electrode 21 is formed hollow and a processing feed pipe gas 22 is connected to a hollow portion of the upper electrode 21 so that a processing gas including, for example, at least either hydrogen bromide (HBr) or chlorine ($Cl_2$) can be introduced from a processing gas source 23 via a mass flow controller (MFC) 24. Further, placed about the middle of the hollow portion is a baffle plate 25 with a plurality of tiny holes for promoting a uniform diffusion of the processing gas, and, below the baffle plate 25 is installed a processing gas inlet 27 constituted by a plate member having a plurality of small holes 26 for injecting the processing gas. Still further, below the processing chamber 2 is provided a gas exhaust port 31 for communicating with a gas exhaust unit including, e.g., a vacuum pump, thereby making it possible to vacuum pump in the processing chamber down to a set vacuum level, e.g., to a depressurized atmosphere below 100 mTorr.

Moreover, below one side of the processing chamber 2 is set a load-lock chamber 33 via a gate valve 32. The load-lock chamber 33 houses a transfer mechanism 24 having a transfer arm 34 (or handling arm). The mounting table is moved down by the elevation mechanism 3 when loading or unloading the wafer W, because, as shown in FIG. 1, the gate valve 32 has an opening below the processing chamber 2. On the contrary, when processing the wafer, the elevation mechanism 3 elevates the mounting table 4 up to a certain height where the distance between the upper electrode 21 and the lower electrode 4 is optimal.

With the above-described configuration of the plasma etching apparatus, the handling arm 34 loads the wafer W as an object to be processed from the load-lock chamber 33 into the processing chamber 2 via the gate valve 32. At this time, the mounting table 4 has been moved down to a loading position by the elevation mechanism 3. The handling arm 34 mounts the wafer W on an adsorption surface of the electrostatic chuck 8 on the mounting table 4, and then, a high voltage is applied to the conductive film 8c in the electrostatic chuck 8 by the DC voltage supply 11 for high voltage so that the wafer W is adsorbed onto the chuck surface by a Coulomb force. Subsequently, the elevation mechanism raises the mounting table 4 up to a processing position. Thereafter, a pressure in the processing chamber is lowered down to a predetermined depressurized atmosphere, e.g., 100 mTorr and the gas source 23 introduces a gaseous mixture of $Cl_2$ and HBr without carbon as a processing gas via the upper electrode 21.

Afterwards, pursuant to the control of the controller 20, a predetermined high-frequency power is applied to the upper electrode 21 by the first high-frequency power supply 29 and another predetermined high-frequency power is applied to the mounting table 4 by the second high-frequency power supply 18. Thus, plasma is generated from the processing gas so that a plasma processing is performed on the wafer W. Later, the controls as to how the high-frequency powers are applied to the two electrodes will be described.

By using the plasma generated as above, an etching process is carried out on the wafer W. During this, the high-frequency powers applied to the two electrodes are monitored by the detectors 19 and 30 so that signals thereof are sent to the controller 20, thereby maintaining an optimal processing condition. After the plasma processing on the wafer W has been finished, the supply of the processing gas is stopped, the inside of the processing chamber is purged, the mounting table 4 is moved down to an unloading position and then the handling arm 34 unloads the wafer W completely processed from the processing chamber 2 to the load-lock chamber 33, thereby finishing the whole process.

Figure 2:
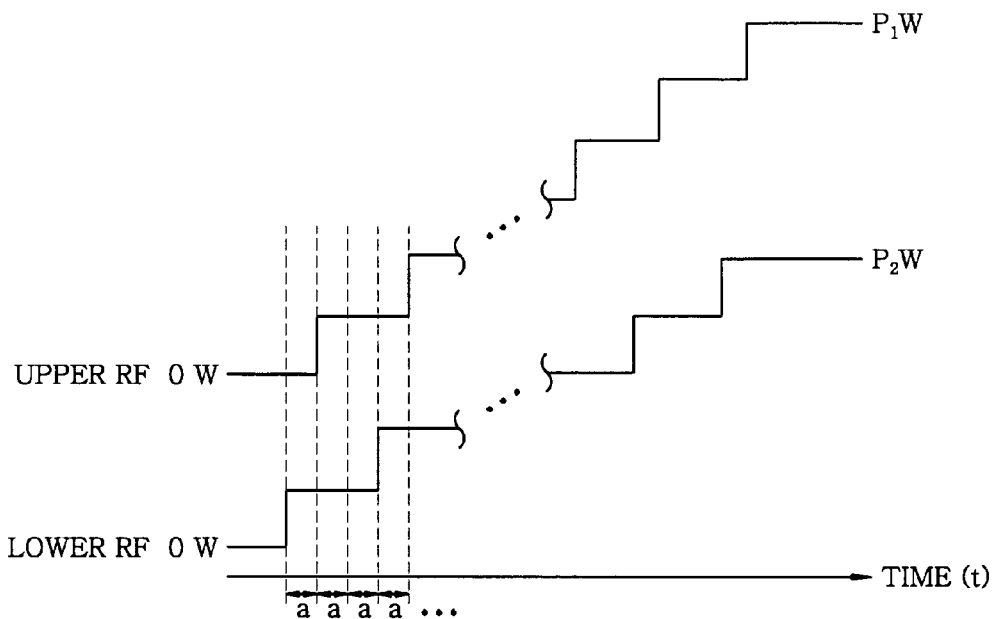
FIG. 2 describes a specific example of raise timings of high-frequency powers applied to two electrodes in the plasma etching apparatus in accordance with the preferred embodiment of the present invention, wherein the respective high-frequency powers are raised to set levels stepwise continuously a certain amount at a time.
Figure 3:
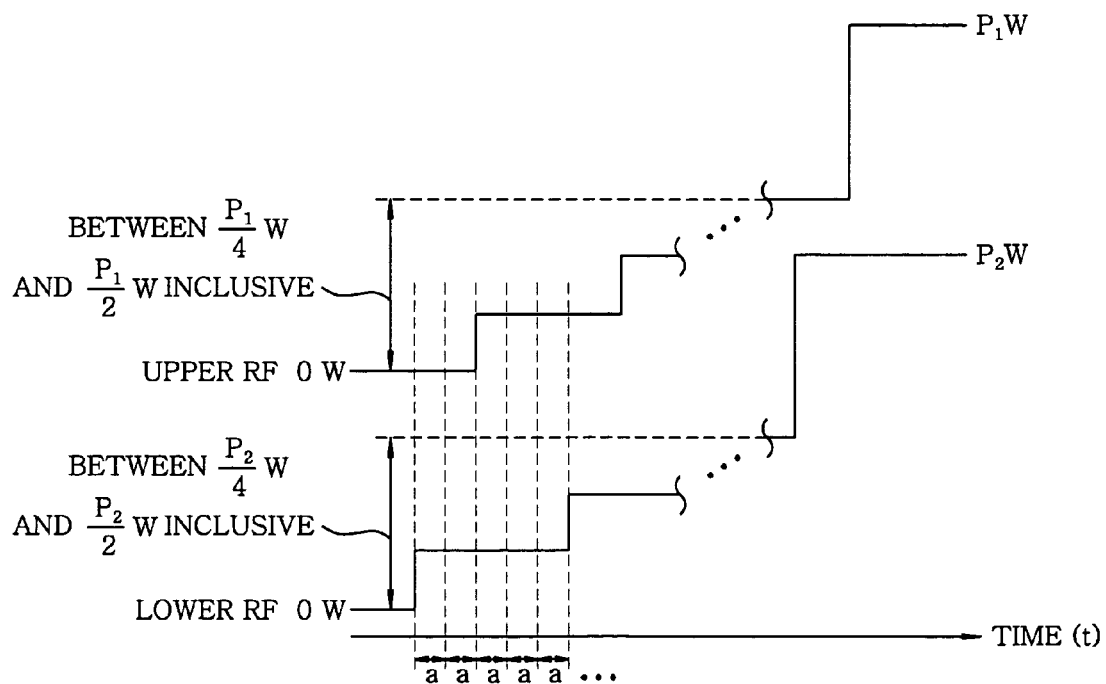
FIG. 3 provides a specific example of raise timings of high-frequency powers applied to two electrodes in the plasma etching apparatus in accordance with the preferred embodiment of the present invention, wherein the respective high-frequency powers are raised stepwise repeatedly a certain amount at a time in the initial stage and then raised directly to the set levels at once right before reaching the set levels.

Hereinafter, a description will be given as to a method for controlling the application of high-frequency powers to the electrodes (which are the upper electrode 21 and the lower electrode 4 in case of the plasma processing apparatus in accordance with the preferred embodiment shown in FIG. 1) with reference to FIGS. 2 to 4. FIGS. 2 to 4 show specific examples of raise timings of the high-frequency powers applied to the two electrodes. FIGS. 2 to 4 describe embodiments where the two high-frequency powers are raised in a stepwise manner.

In accordance with these embodiments, the outputs of the two high-frequency power supplies 18 and 29 are raised up to a set level (a recipe level) for the plasma processing on the wafer W by being raised at least three times in a stepwise manner. While the high-frequency power are raised up to the set level in a stepwise manner as described above, the controller 20 controls the raise timings of the outputs of the two high-frequency power supplies 18 and 29 such that the output of the second high-frequency power supply 18 applied to the lower electrode 4 is raised earlier than the output of the first high-frequency power supply 29.

More particularly, for example, a certain level of high-frequency power is firstly applied to the lower electrode 4 while the high-frequency power applied to the upper electrode 21 remains 0 W, as shown in FIG. 2. Subsequently, after a certain period of time, a certain amount of high-frequency power is applied to the upper electrode 21 while the high-frequency power applied to the lower electrode 4 remains substantially the same. By doing this, a plasma is ignited. Thereafter, high-frequency powers are alternately applied stepwise to the lower electrode 4 and to the upper electrode 21 respectively, thereby reaching the set levels $P_1W$ and $P_2W$ eventually.

Thus, plasma can be generated efficiently, thereby further reducing damages on an object to be processed and further reducing the loads on the high-frequency power supply, matching unit or so forth.

Further, as shown in FIG. 2, the output of one of the high-frequency power supplies 18 and 29 is controlled to be raised while the output of the other high-frequency power supply is kept constant. Thus, it is possible to control the output of one of the high-frequency power supplies to change while the output of the other high-frequency power supply is made stable by a matching operation of the matching unit, thereby efficiently reducing the loads on the high-frequency power supply or the matching unit. It is preferable that the period between raising the high-frequency power to the upper electrode and then raising the high-frequency power to the lower electrode is either equal to or longer than the period between raising the high-frequency power to the lower electrode and then raising the high-frequency power to the upper electrode. It is more preferable that the two periods are the same.

In addition, a high-frequency power difference, i.e., the difference between the two outputs of the two high-frequency power supplies 18 and 29 is controlled to remain below a certain value. Thus, the high-frequency power applied to the lower electrode 4 can be restrained not to become too high compared to the high-frequency power applied to the upper electrode 21, thereby further reducing a load on the power supply or the matching unit.

Furthermore, in FIG. 2, $P_1W$ is the set level of the high-frequency power applied to the upper electrode 21 and $P_2W$ is the set level of the high-frequency power applied to the lower electrode 4 (the same is applied for FIGS. 3, 5 and 6 as will be described later). $P_1W$ and $P_2W$ can be set to appropriate values pursuant to the type of a plasma processing, processing condition and the like. For example, $P_1W$ applied to the upper electrode 21 is 3300 W and $P_2W$ applied to the lower electrode 4 is 3800 W.

It is preferable that the time unit (the time interval a illustrated in FIG. 2) by which each of the high-frequency powers controlled is raised, for example, is between 0.1 and 0.5 second inclusive. As shown in FIG. 2, the high-frequency powers can be controlled to be raised every time when the time interval "a" elapses (for example, every 0.1 second). The time interval "a" is set to be an appropriate span based on magnitudes of the set levels of the high-frequency powers or required periods of time for the high-frequency powers to reach the set levels.

Preferably, a period of time for each high-frequency power to reach its set level is 2 to 5 seconds. In case shown in FIG. 2, the high-frequency power applied to the lower electrode 4 reaches its set level $P_2W$ earlier than that applied to the upper electrode 21. A period of time from an application of the high-frequency power to the lower electrode 4 until the high-frequency power applied to the upper electrode 21 reaches the set level $P_1W$ is, for example, 2.5 seconds.

A raised level of each high-frequency power at each step may vary among raise times. However, it is more preferable that the raised level of each high-frequency power stays constant. For example, the raised level may increase slowly at each rising stage. It is also possible to control the output of each high-frequency power supply such that it ranges inclusively between 25% and 50% of each set level until right before it reaches the set level and then goes up to the set level at once, as shown in FIG. 3. In this case, it is preferable that the output of each high-frequency power supply be not less than an output level where plasma can be ignited (for example, not less than 200 W) and not more than 25% of each set level. More particularly, as shown in FIG. 4, a high-frequency power of 400 W is initially applied to the lower electrode 4 at time 0. Thereafter, high-frequency powers are alternately applied to the lower electrode 4 and the upper electrode 21 every 0.4 second in an increasing manner. Right before the high-frequency powers reach their set levels (in this case, 3300 W and 3800 W), they are set to range inclusively between 25% and 50% of their set levels, e.g., 1200 W. Then, the high-frequency powers are controlled to go up to the set level at once.

In this way, the high-frequency power applied to each electrode is raised up to an amount sufficient for igniting a plasma at the initial stage, and then raised slowly to range inclusively between 25% and 50% of its set level right before reaching the set level, and then raised up to the set level at once, thereby ensuring that a plasma is ignited, reducing damages on the object to be processed, or reducing loads on the power supplies or matching units, and shortening the required periods of time to reach the set levels.

Figure 7:
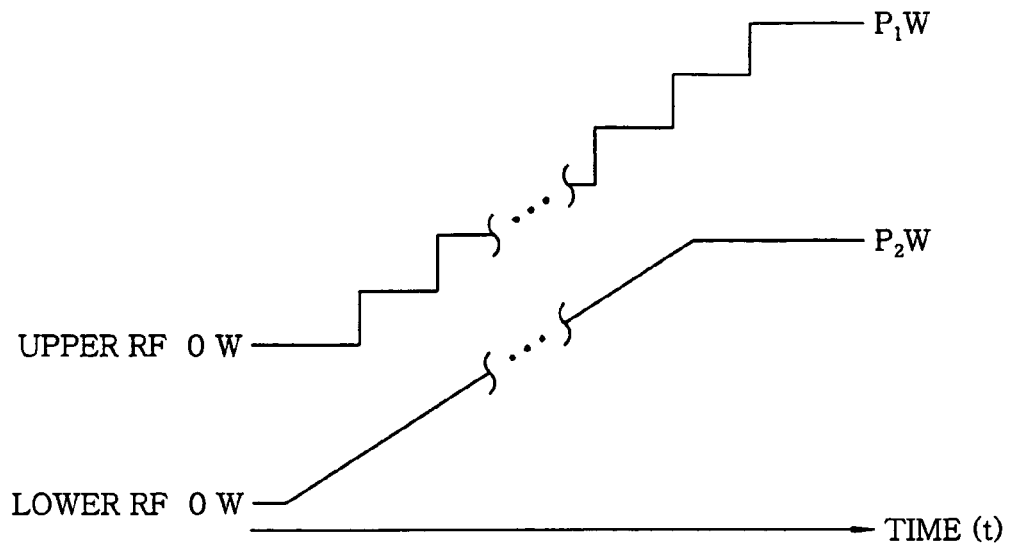
FIG. 7 presents another example of raise timings of high-frequency powers applied to two electrodes in the plasma etching apparatus in accordance with the preferred embodiment of the present invention, wherein the high-frequency power to one of the electrodes is raised stepwise while that to the other electrode is raised continuously and FIG. 8 provides a cross sectional view illustrating a schematic configuration of a conventional plasma etching apparatus with two electrodes.
Figure 8:
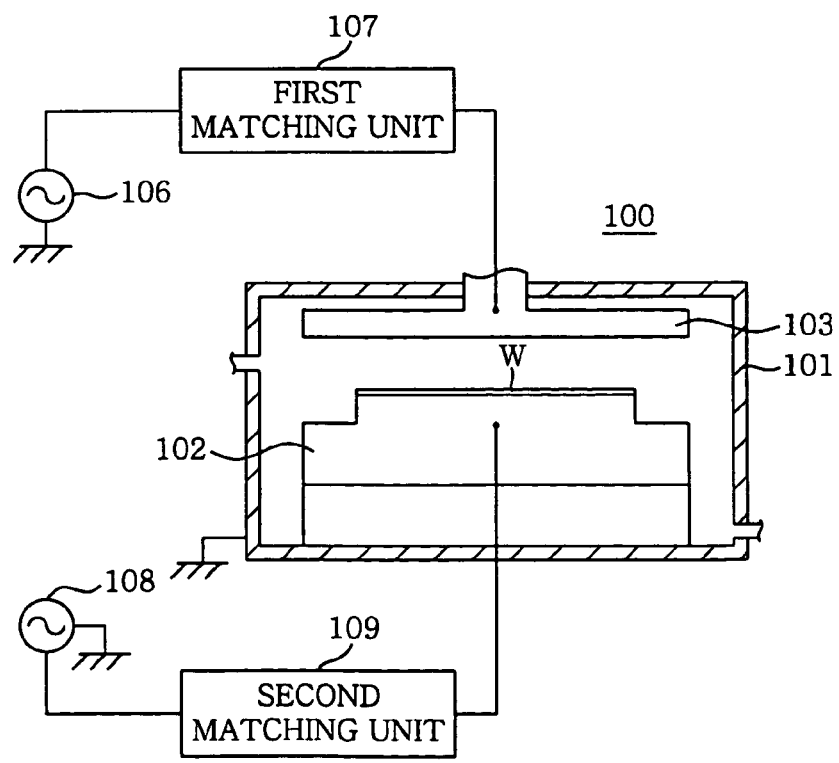

Hereinafter, other examples of the method for controlling application of the high-frequency power to each electrode will be described with reference to FIGS. 5 to 7. FIGS. 5 to 7 illustrate other examples of raise timings of high-frequency powers applied to the electrodes. FIGS. 5 to 7 depict other examples where the high-frequency powers applied to each electrode is raised in a continuous manner up to the set level or raised in a stepwise manner during a certain part of time and in a continuous manner during the other part of time.

As shown in FIG. 5, it is allowable that, after the high-frequency powers begin to be simultaneously applied to the upper electrode 21 and the lower electrode 4, the high-frequency power applied to each electrode are raised in a continuous manner until it reaches its set level $P_1W$ or $P_2W$. In this way, since each high-frequency power is raised slowly, damages on the object to be processed can be further reduced and loads on the high-frequency power supplies or matching units can be further alleviated.

In this case, it is preferable that the output (the high-frequency powers) ratios between the high-frequency power supplies 18 and 29 are kept constant or their slopes of the outputs (the high-frequency powers) of the high-frequency power supplies 18 and 29 as they go up are kept identical to each other. Thus, the high-frequency power applied to the lower electrode 4 can be controlled to be not too high relative to the high-frequency power applied to the upper electrode 21. In this way, loads on the power supplies or the matching units can be further reduced. Further, in case the output ratios (the high-frequency powers) between the high-frequency power supplies 18 and 29 are controlled to be constant or their output (the high-frequency powers) slopes of the high-frequency power supplies 18 and 29 as they go up are controlled to be identical to each other, the overall period for the high-frequency power applied to each electrode to reach the set level $P_1W$ or $P_2W$ is set based on the set level $P_1W$ or $P_2W$. Therefore, the periods of time for the high-frequency powers applied to the electrodes to reach the set levels $P_1W$ and $P_2W$ may be identical to or different from each other.

As described above, it is preferable that the outputs of the high-frequency power supplies 18 and 29 may be raised in a stepwise manner during a certain part of time and in a continuous manner during the other part of time. In this case, it is preferable that the part of time during which the outputs are raised in a stepwise manner be an initial period during which plasma is ignited, as shown in FIG. 6. Thus, the ignition of the plasma can be performed efficiently at the initial stage during which the high-frequency powers begin to be applied.

In addition, as shown in FIG. 7, it is also preferable that the high-frequency power applied to one of the electrodes is raised in a stepwise manner and the high-frequency power applied to the other electrode is raised in a continuous manner. In this case, the output of the first high-frequency power supply 29 applied to the upper electrode 21 may be raised in a stepwise manner and the second high-frequency power supply 18 applied to the lower electrode 4 may be raised in a continuous manner.

While the invention has been shown and described with respect to the preferred embodiments, it will be understood by those skilled in the art that various changes and modifications may be made without departing from the spirit and scope of the invention as defined in the following claims.

For example, although the preferred embodiments were described as to the case where the high-frequency powers are applied from the electrodes 18 and 29 to the upper electrode 21 and the lower electrode 4, the invention is not limited thereto but includes the case where two high-frequency powers (for example, a high-frequency power for generating plasma and another high-frequency power for attracting charged particles such as ions) are applied to the lower electrode 4. For example, the first high-frequency power supply 29 may be used for generating plasma and the second high-frequency power supply 18 may be used for attracting charged particles such as ions. In this case, a frequency of the first high-frequency power supply 29 is set, for example, between 60 and 100 MHz inclusive and a frequency of the second high-frequency power supply 18 is set, for example, between 2 and 3.2 MHz inclusive.

Further, although the preferred embodiments were described as to a plasma etching apparatus, the invention can also be applied to any apparatuses that introduce a processing gas into a processing chamber and include an upper electrode, lower electrode, first and second high-frequency power supply for applying a high-frequency power to each of the electrodes to perform a plasma processing, for example, a plasma CVD apparatus, an ashing apparatus and so forth.

Furthermore, although the preferred embodiments were described as to an etching process on polysilicon, the invention can also be applied to an etching process on an oxide film, photoresist or refractory metals such as tungsten silicide, molybdenum silicide, titan silicide and the like.

The present invention can be applied to a plasma processing apparatus and a control method thereof.

What is claimed is:

1. A plasma processing apparatus, comprising:
   a lower electrode disposed in a processing chamber, capable of mounting an object to be processed thereon;
   an upper electrode disposed in the chamber to face the lower electrode;
   a first high-frequency power supply and a second high-frequency power supply for applying high-frequency powers to the lower electrode; and
   an output controller for raising respective outputs of the first and the second high-frequency power supply up to respective set levels for processing the object to be processed,
   wherein the output controller controls the respective outputs of the high-frequency power supplies to be raised stepwise in at least three steps,
   wherein the output controller regulates raise timings of the outputs of the respective high-frequency power supplies so that raising the output of the second high-frequency power supply is followed by raising the output of the first high-frequency power supply, and
   wherein the output of the first high-frequency power supply is higher than the output of the second high-frequency power supply.

2. The plasma processing apparatus of claim 1, wherein the output controller controls the outputs of the respective high-frequency power supplies so that the outputs right before reaching the respective set levels are within 25% and 50% of the set levels.

3. A plasma processing apparatus, comprising:
   a lower electrode disposed in a processing chamber, capable of mounting an object to be processed thereon;
   an upper electrode disposed in the chamber to face the lower electrode;
   a first high-frequency power supply and a second high-frequency power supply for applying high-frequency powers to at least one of the upper and the lower electrode; and
   an output controller for raising respective outputs of the first and the second high- frequency power supply up to respective set levels for processing the object to be processed,
   wherein the output controller regulates raise timings of the outputs of the respective high-frequency power supplies so that raising the output of the second high-frequency power supply is followed by raising the output of the first high-frequency power supply, while the outputs of the high-frequency power supplies are raised up to the respective set levels, and
   wherein the output controller controls the outputs of the high-frequency power supplies to be raised stepwise during a certain interval and continuously during the rest.

4. The plasma processing apparatus of claim 3, wherein the output controller regulates the outputs of the respective high-frequency power supplies so that ratios between the respective outputs remain constant or slopes of the outputs of the respective power supplies are identical as they go up while the output controller controls the outputs of both of the first and the second high-frequency power supply continuously.

5. The plasma processing apparatus of claim 3, wherein the interval during which the respective outputs are raised stepwise is an initial stage during which plasma is ignited.

6. The plasma processing apparatus of claim 3, wherein the output controller controls the outputs of the respective high-frequency power supplies so that the outputs right before reaching the respective set levels are within 25% and 50% of the set levels.

7. The plasma processing apparatus of claim 3, wherein the output controller regulates the outputs of the respective high-frequency power supplies so that the output of one high-frequency power supply goes up stepwise while the other output goes up continuously.

8. The plasma processing apparatus of claim 7, wherein the output of the first high-frequency power supply is applied to the upper electrode and the output of the second high-frequency power supply is applied to the lower electrode, the output controller regulating the respective outputs so that the output of the first high-frequency power supply goes up stepwise while the output of the second high-frequency power supply goes up continuously.

9. A method for controlling a plasma processing apparatus including a lower electrode in a processing chamber on which an object to be processed is mounted, an upper electrode disposed in the chamber to face the lower electrode, and a first high-frequency power supply and a second high-frequency power supply for applying high-frequency powers to the lower electrode, the method comprising the step of:
   raising respective outputs of the high-frequency power supplies to reach respective set levels for processing the object to be processed, wherein the respective outputs of the high-frequency power supplies are controlled to be raised stepwise in at least three steps, wherein respective raise timings of the outputs of the high-frequency power supplies are controlled such that raising the output of the second high-frequency power supply is followed by raising the output of the first high-frequency power supply while the respective outputs of the high-frequency power supplies are raised to the respective set levels, and wherein the outputs of the high-frequency power supplies are supplied to the lower electrode.

10. The method of claim 9, wherein the outputs of the respective high-frequency power supplies are controlled so that the outputs right before reaching the respective set levels are within 25% and 50% of the set levels.

11. A method for controlling a plasma processing apparatus including a lower electrode in a processing chamber on which an object to be processed is mounted, an upper electrode disposed in the chamber to face the lower electrode, and a first high-frequency power supply and a second high-frequency power supply for applying high-frequency powers to at least one of the upper and the lower electrode, the method comprising the step of:

raising respective outputs of the high-frequency power supplies to reach respective set levels for processing the object to be processed, wherein respective raise timings of the outputs of the high-frequency power supplies are controlled such that raising the output of the second high-frequency power supply is followed by raising the output of the first high-frequency power supply while the respective outputs of the high-frequency power supplies are raised to the respective set levels, and wherein the outputs of the high-frequency power supplies are controlled to be raised stepwise during a certain interval and continuously during the rest.

12. The method of claim 11, wherein the outputs of the respective high-frequency power supplies are regulated so that ratios between the respective outputs remain constant or slopes of the outputs of the respective power supplies are identical as they go up while an output controller controls the outputs of both of the first and the second high-frequency power supply continuously.

13. The method of claim 11, wherein the interval during which the respective outputs are raised stepwise is an initial stage during which plasma is ignited.

14. The method of claim 11, wherein the outputs of the respective high-frequency power supplies are controlled so that the outputs right before reaching the respective set levels are within 25% and 50% of the set levels.

15. The method of claim 11, wherein the outputs from the respective high-frequency power supplies are regulated so that the output of one high-frequency power supply goes up stepwise while the other output goes up continuously.

16. The method of claim 15, wherein the output of the first high-frequency power supply is applied to the upper electrode and the output of the second high-frequency power supply is applied to the lower electrode, the respective outputs are regulated so that the output of the first high-frequency power supply goes up stepwise while the output of the second high-frequency power supply goes up continuously.

* * * * *